(12) United States Patent
Meyer et al.

(10) Patent No.: US 7,100,135 B2
(45) Date of Patent: Aug. 29, 2006

(54) METHOD AND SYSTEM TO EVALUATE SIGNAL LINE SPACING

(75) Inventors: Neal Meyer, Chandler, AZ (US); Brett Neal, Gilbert, AZ (US); Andrew McRonald, Beaverton, OR (US); Lee Genz, Chandler, AZ (US); Ping Sun, Gilbert, AZ (US); Gene Garrison, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 10/871,809

(22) Filed: Jun. 18, 2004

(65) Prior Publication Data

US 2005/0283745 A1 Dec. 22, 2005

(51) Int. Cl.
*G06F 17/50* (2006.01)
(52) U.S. Cl. ....................................................... 716/5
(58) Field of Classification Search .................. 716/5
See application file for complete search history.

(56) References Cited

U.S. PATENT DOCUMENTS

| | | | | |
|---|---|---|---|---|
| 5,590,049 | A * | 12/1996 | Arora ............................ | 716/5 |
| 5,781,446 | A * | 7/1998 | Wu ............................... | 716/9 |
| 6,301,689 | B1 * | 10/2001 | Darden ......................... | 716/5 |
| 6,349,402 | B1 * | 2/2002 | Lin ............................... | 716/2 |
| 6,466,008 | B1 * | 10/2002 | Fung et al. ............. | 324/158.1 |
| 6,594,805 | B1 * | 7/2003 | Tetelbaum et al. ............. | 716/5 |
| 6,807,657 | B1 * | 10/2004 | Frank et al. ................... | 716/5 |
| 2001/0042236 | A1 * | 11/2001 | Darden .......................... | 716/4 |
| 2002/0073384 | A1 * | 6/2002 | Buffet et al. ................... | 716/4 |
| 2004/0015796 | A1 * | 1/2004 | Frank et al. ................... | 716/5 |
| 2004/0163056 | A1 * | 8/2004 | Frank et al. ................... | 716/5 |
| 2004/0163058 | A1 * | 8/2004 | Frank et al. ................... | 716/5 |
| 2005/0120316 | A1 * | 6/2005 | Suaya et al. ................... | 716/4 |
| 2005/0193354 | A1 * | 9/2005 | Ohba et al. .................... | 716/5 |

* cited by examiner

*Primary Examiner*—Paul Dinh
*Assistant Examiner*—Suchin Parihar
(74) *Attorney, Agent, or Firm*—Buckley, Maschoff & Talwalkar LLC

(57) ABSTRACT

A system to evaluate a distance between polyline segments includes identification of a first polyline and a second polyline associated with a differential signal, determination of whether a distance between a segment of the first polyline and a segment of the second polyline is within a first tolerance, and, if the distance is not within the first tolerance, determining whether the distance is within a second tolerance. If the distance is not within the first tolerance and is within the second tolerance, it is determined whether the length of the segment of the first polyline is less than a first threshold. If the distance is not within the first tolerance and is within the second tolerance, and if the length of the segment of the first polyline is less than the first threshold, it is indicated that the first polyline and the second polyline are sufficiently spaced. If the distance is not within the second tolerance or if the length of the segment of the first polyline is greater than the first threshold, it is determined whether the segments are located near a device pin, and, if the segments are not located near a device pin, it is indicated that the first polyline and the second polyline are not sufficiently spaced.

7 Claims, 12 Drawing Sheets

METHOD AND SYSTEM TO EVALUATE SIGNAL LINE SPACING

BACKGROUND

An electronic system may utilize a substrate to carry electrical signals between components thereof. The substrate may consist of one or several layers of conductive signal lines, or nets, over which the signals are to travel. The nets are disposed on and in the substrate so as to connect electrical components as called for by the design of the electronic system. Certain arrangements of the nets may provide more efficient performance, manufacturing, and/or production than other arrangements. Design rules may be used to identify disadvantageous arrangements.

DETAILED DESCRIPTION

Figure 1:
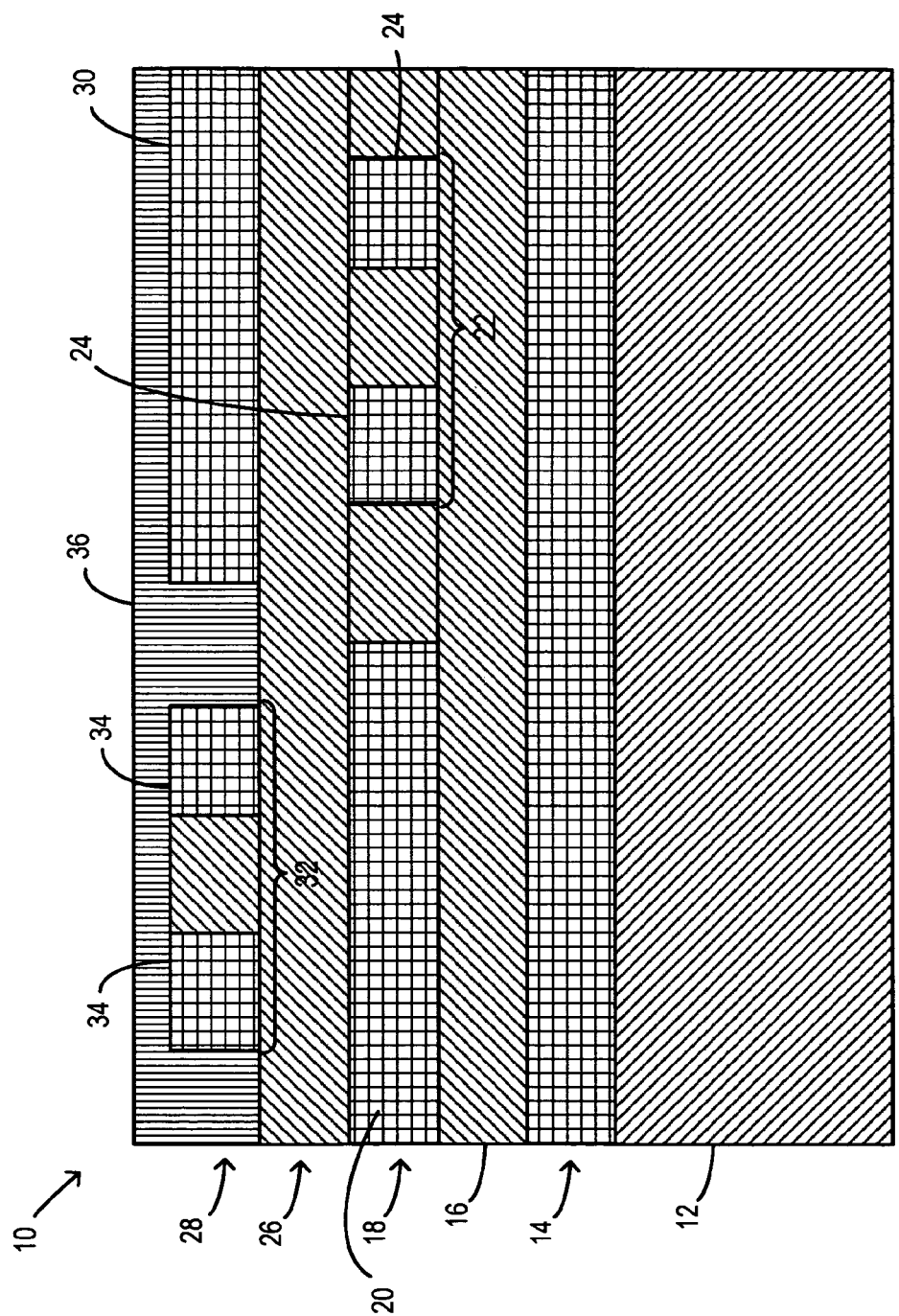
FIG. 1 is a cross-sectional side view of a substrate according to some embodiments.

FIG. 1 is a cross-sectional side view of circuit board 10 according to some embodiments. Circuit board 10 includes layers of nets that may be arranged according to design rules such as those described herein.

Circuit board 10 includes core or base layer 12. Base layer 12 may be rigid or flexible, and examples of its composition include but are not limited to epoxy resin. Circuit board 10 also includes first metallization layer 14 disposed on core layer 12, which may comprise a continuous ground plane. In some embodiments, layer 14 may be formed of copper. Intermediate dielectric layer 16 is formed on first metallization layer 14. The intermediate dielectric layer 16 may be formed of a dielectric material different from or identical to the material of which base layer 12 is formed.

Second metallization layer 18 is formed on intermediate dielectric layer 16. In the illustrated embodiment, a portion of second metallization layer 18 is formed as ground plane 20. Also formed as part of the second metallization layer 18 is stripline structure 22 that includes a pair of signal traces, or nets 24. Nets 24 and ground plane 20 may be formed of copper and are separated from one another by dielectric material. Another intermediate dielectric layer 26 may be formed on second metallization layer 18. Like dielectric layer 16, the dielectric layer 26 may be formed of a dielectric material different from or identical to the material of which base layer 12 is formed.

Third metallization layer 28 is formed on dielectric layer 26. A portion of third metallization layer 28 is formed as second ground plane 30, which serves as a reference net for stripline structure 22. Also formed as part of third metallization layer 28 is stripline structure 32 that includes a pair of nets 34. Nets 34 and ground plane 30 may be formed of copper and are separated by dielectric material. Solder mask layer 36 is formed on third metallization layer 28 and is also formed on dielectric layer 26 at locations where third metallization layer 28 does not cover dielectric layer 26.

Figure 2:
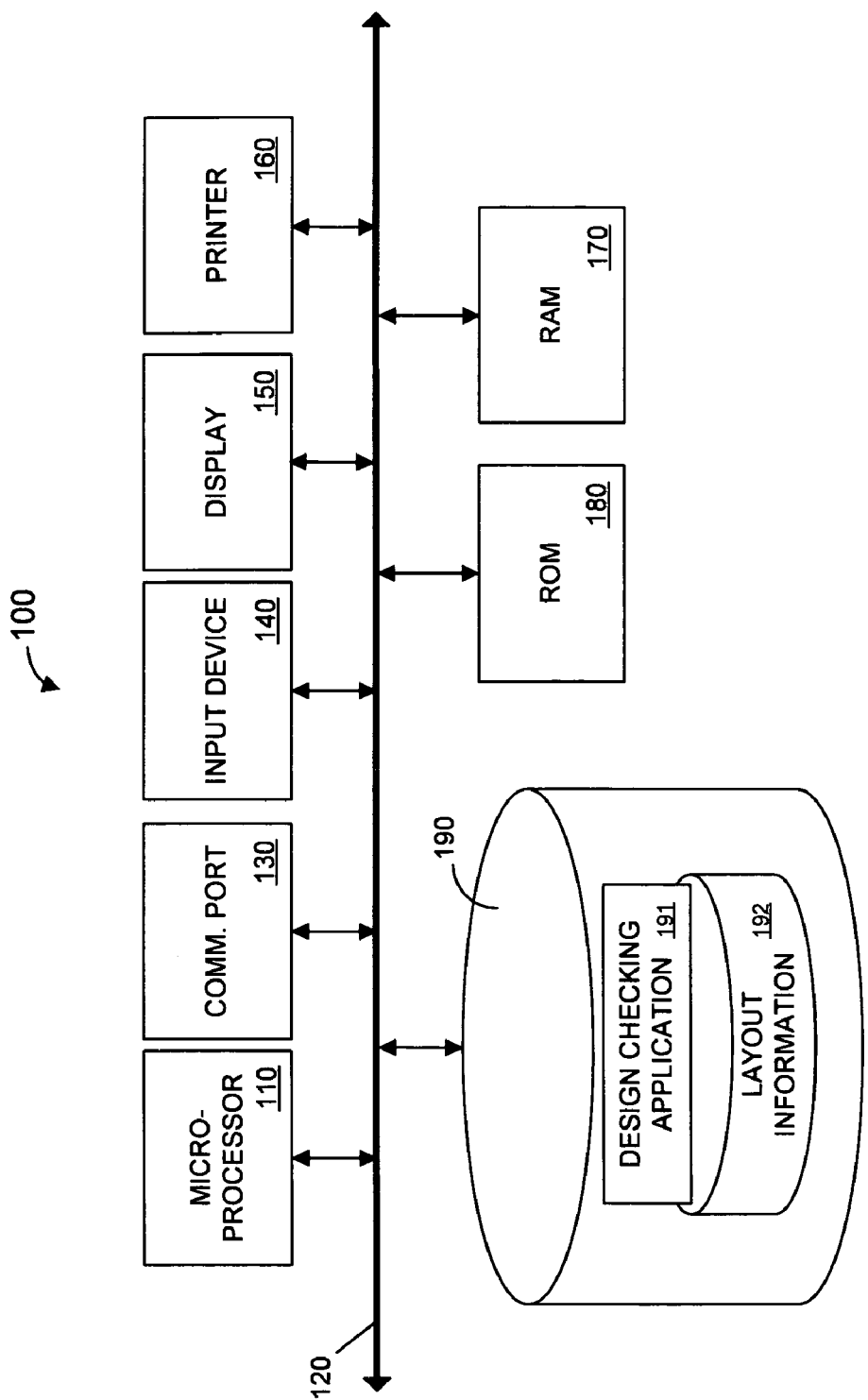
FIG. 2 is a block diagram of a computer system according to some embodiments.

FIG. 2 is a block diagram of an internal architecture of computer system 100 according to some embodiments of the invention. Computer system 100 may be used in to perform design checks according to some embodiments. More particularly, computer system 100 may execute code to check circuit layouts based on design rules according to some embodiments. Computer system 100 may comprise a desktop computer system.

Computer system 100 includes microprocessor 110 in communication with communication bus 120. Microprocessor 110 may comprise a RISC-based or other type of processor. Microprocessor 110 executes code to control the elements of computer system 100 to provide desired functionality.

Also in communication with communication bus 120 is communication port 130. Communication port 130 may be used to transmit data to and to receive data from devices external to computer system 100. Communication port 130 is therefore preferably configured with hardware suitable to physically interface with desired external devices and/or network connections. For example, communication port 130 may comprise an Ethernet connection to a local area network through which computer system 100 may receive layout information from a layout design workstation.

Input device 140, display 150 and printer 160 are also in communication with communication bus 120. Any known input device may comprise input device 140, including a keyboard, mouse, touch pad, voice-recognition system, or any combination of these devices. As mentioned above, information may also be input to computer system 100 from other devices via communication port 130. Display 150 may be an integral or separate CRT display, flat-panel display or the like used to display graphics and text in response to commands issued by microprocessor 110. Printer 160 may also present text and graphics to an operator, but in hardcopy form using ink-jet, thermal, dot-matrix, laser, or other printing technologies.

RAM 170 is connected to communication bus 120 to provide microprocessor 110 with fast data storage and retrieval. In this regard, processor-executable code being executed by microprocessor 110 is typically stored temporarily in RAM 170 and executed therefrom by microprocessor 110. Any suitable memory may be used as RAM 170, including a Single Data Rate Random Access Memory, a Double Data Rate Random Access Memory, or a Programmable Read Only Memory. ROM 180, in contrast, provides storage from which data can be retrieved but to which data cannot be stored. Accordingly, ROM 180 may be used to store invariant process steps and other data, such as basic input/output instructions and data used during boot-up of computer system 100 or to control communication port 130.

Data storage device 190 stores, among other data, processor-executable code of design checking application 191. Microprocessor 110 therefore executes the code of design checking application 191 in order to control computer system 100 to check circuit layouts according to some embodiments.

The code of design checking application 191 may be read from a computer-readable medium, such as a floppy disk, a CD-ROM, a DVD-ROM, a Zip™ disk, a magnetic tape, or a signal encoding the process steps, and then stored in data storage device 190 in a compressed, uncompiled and/or encrypted format. In alternative embodiments, hard-wired circuitry may be used in place of, or in combination with, processor-executable code for implementation of processes according to some embodiments. Thus, embodiments are not limited to any specific combination of hardware and software.

Design checking application 191 may utilize information stored in layout information database 192. This information may include details of circuit layouts to be checked using design checking application 191. For example, layout information database 192 may include information regarding locations and layers in which a net resides, device locations, pin locations, dielectric layer thicknesses, and the like.

Also stored in data storage device 190 may also be other unshown elements that may be necessary for operation of computer system 100, such as an operating system, a database management system, and "device drivers" for allowing microprocessor 110 to interface with other elements of computer system 100. Data storage device 190 may also include other applications and other data files to provide functionality such as Web browsing, calendaring, e-mail access, word processing, accounting, presentation development and the like. These elements are known to those in the art, and are therefore not described in detail herein.

Figure 3:
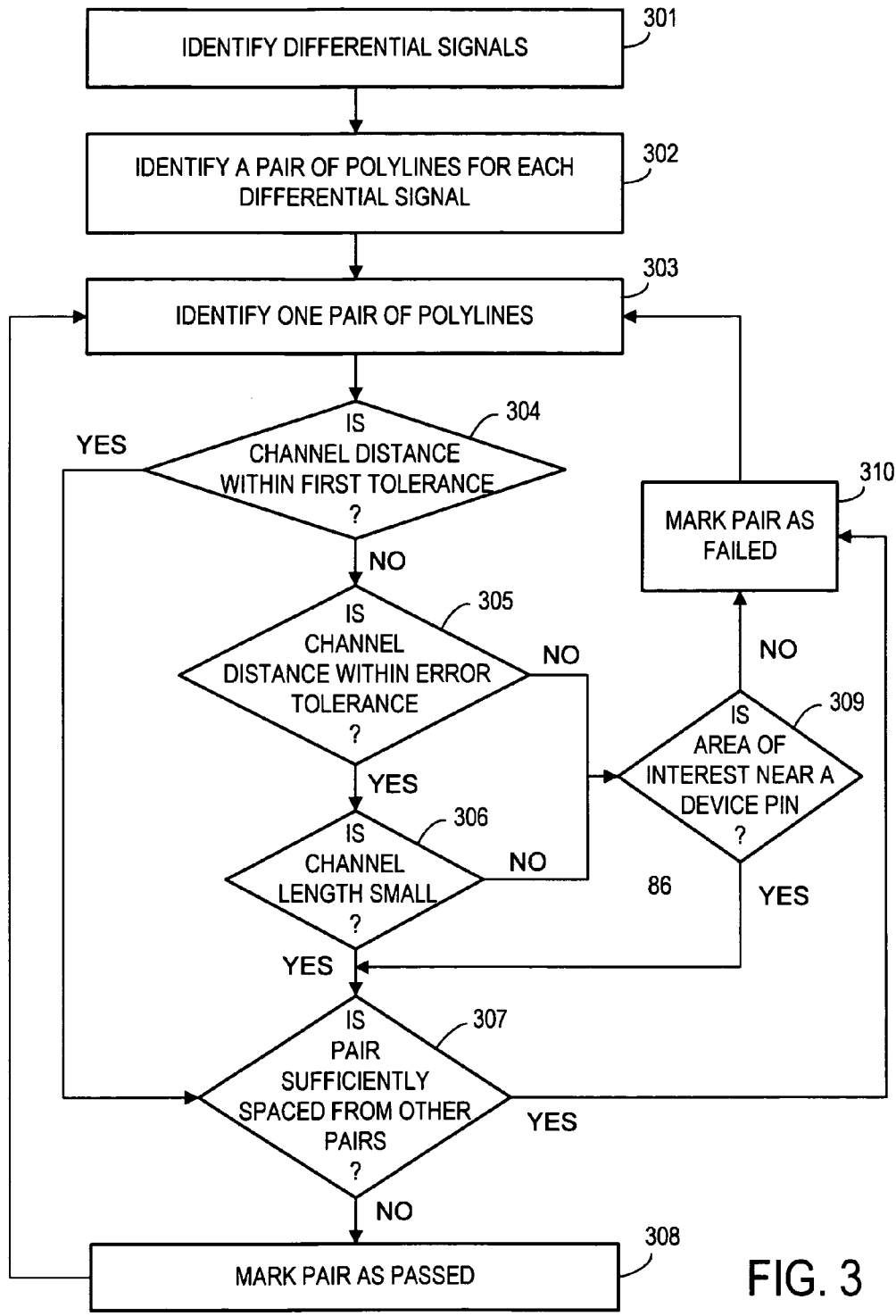
FIG. 3 is a flow diagram according to some embodiments.

FIG. 3 illustrates a flow diagram 300 of a process to check the spacing between differential signal lines according to some embodiments. Flow diagram 300 and the other flow diagrams described herein illustrate processes that may be executed by any combination of hardware, software and/or manual implementations. For example, the processes may be executed by microprocessor 110 executing processor-executable code of design checking application 191.

Initially, at 301, differential signals are identified. The differential signals may comprise all differential signals that belong to a particular circuit to be embodied by a particular layout. Layout information database 192 may include information associated with each differential signal of the particular circuit, therefore the differential signals may be identified therefrom at 301.

A pair of polylines is identified for each differential signal at 302. Each differential signal includes two component signals and is therefore carried by a pair of separate conductive paths. A pair of conductive paths may be associated with each differential signal in layout information database 192. A typical motherboard may include 30 to 40 pairs routed across multiple layers. A polyline is a portion of such a conductive path, located in a single routing layer and connecting two elements, such as a pin and a via, within the path.

Figure 4:
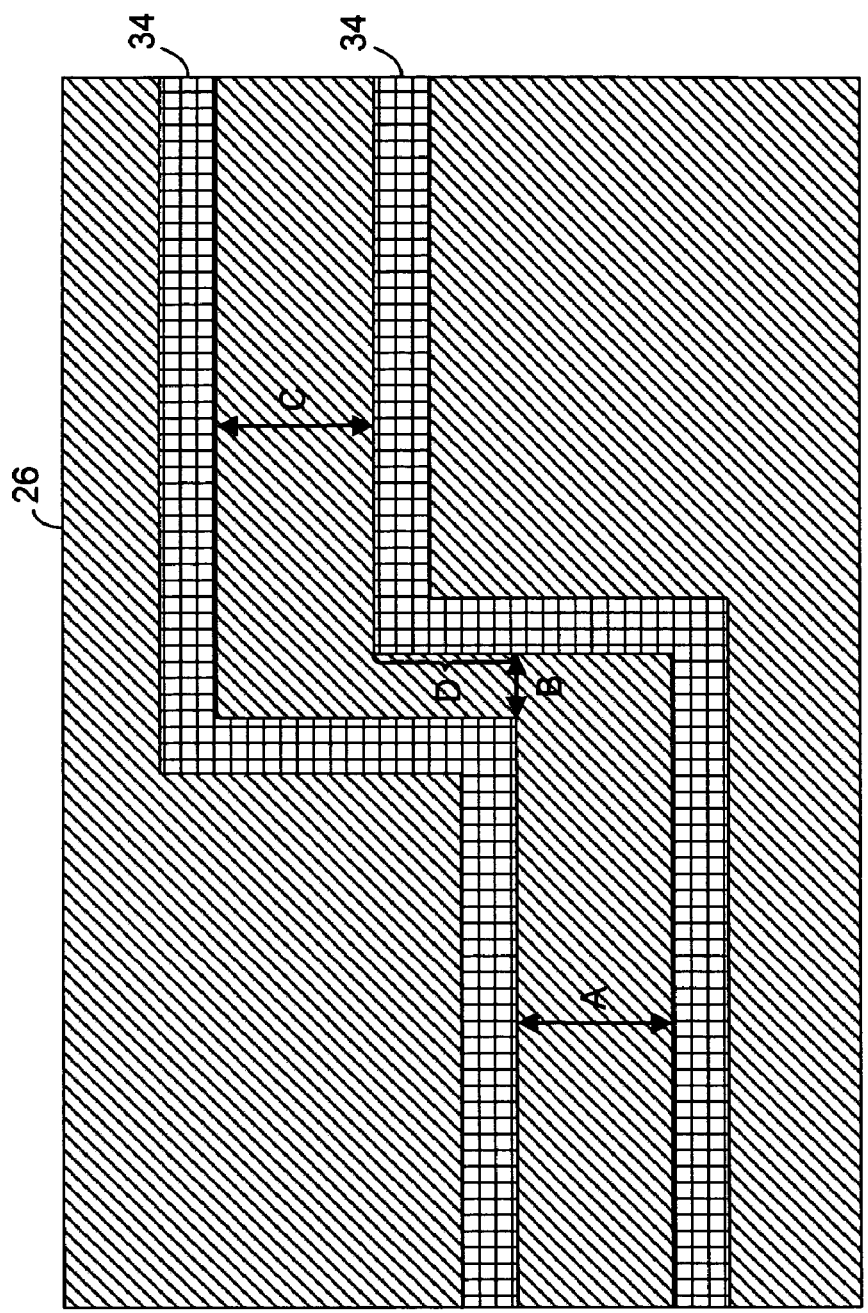
FIG. 4 is a view of polylines according to some embodiments.

One of the pairs of polylines is identified at 303. The pair of polylines is associated with a differential signal. FIG. 4 illustrates portions of nets 34, which may be identified as polylines at 303. As described with respect to FIG. 1, polylines 34 are disposed in a signaling layer above dielectric layer 26. The identified polylines may be length-matched at 303 to ensure that they remain close as they transition between substrate layers.

At 304, it is determined whether a channel distance between polylines 34 is within a first tolerance. The channel distance may be determined based on location information stored in layout information database 192. The first tolerance may be a value or range of values, may be hard-coded into design checking application 191, may be user-definable, and/or may be determined based on properties of the subject electrical device. In one example of 304, it may be determined that channel distances A and C of FIG. 4 are within a first tolerance that specifies a maximum and a minimum channel distance. However, it may be determined that distance B is less than the minimum channel distance.

In the foregoing example, flow proceeds to 305, in which it is determined whether channel distance B is within a second tolerance. The second tolerance may also be a value or range of values, hard-coded into design checking application 191, user-definable, and/or determined based on properties of the subject electrical device. The second tolerance may be less stringent than the first tolerance, allowing for some deviation from the first tolerance.

It will temporarily be assumed that channel distance B is within the second tolerance. Therefore, at 306, it is determined whether the length of the channel that is within the second tolerance is small. The subject distance is shown in FIG. 4 as distance D. Distance D is compared at 306 with a first threshold that again may be hard-coded, user-definable, and/or device-dependent. If distance D is less than the first threshold, it is then determined, based on information stored in layout information database 192, whether the pair of polylines is sufficiently spaced from other polyline pairs identified at 302. This determination at 307 may be based on a second threshold that is hard-coded, user-definable, and/or device-dependent. The second threshold may be defined so as to limit non-common mode noise on the subject pair of polylines.

The polyline pair identified at 303 is marked as passed if flow reaches 308. Next, another of the pair of polylines is identified at 303 and flow continues as described above. As shown in FIG. 3, flow may reach 307 directly from 304 if it is determined at 304 that the channel distance is within the first tolerance. Accordingly, the foregoing design check may allow a deviance of channel spacing from a first threshold as long as the deviance is small and does not extend too far along the channel.

In some examples, flow proceeds to 309 from 305 or 306 if the determination of 305 or 306 is negative. At 309, it is determined whether the area of interest (in this case the area having channel spacing B) is near a device pin. The determination at 309 may allow for an exception to the general design rule reflected by the first tolerance, the second tolerance and the first threshold. If the determination is positive, flow continues to 307. If not, the pair is marked as failed at 310. The pair may also be marked as failed at 310 if the determination of 307 is negative. Another pair of polylines is identified at 303 after a pair of polylines is marked as failed at 310.

Figure 5A:
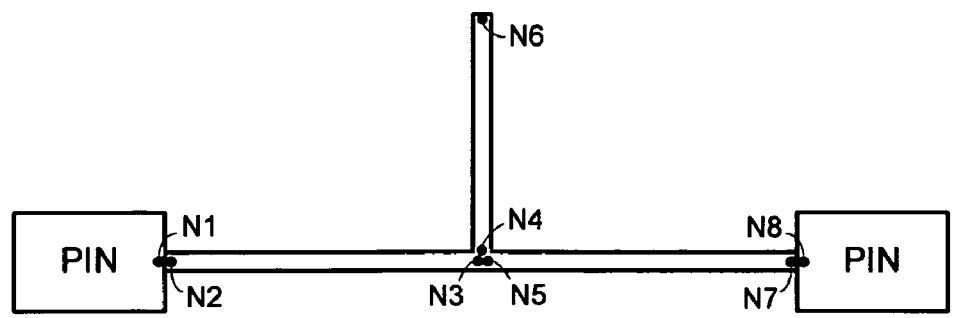
FIGS. 5A through 5C are views of stub-related net layouts according to some embodiments.
Figure 5B:
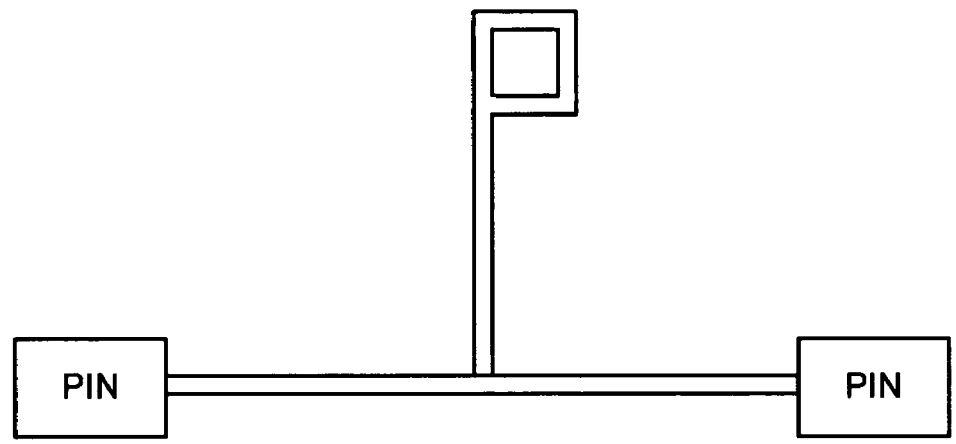
Figure 5C:
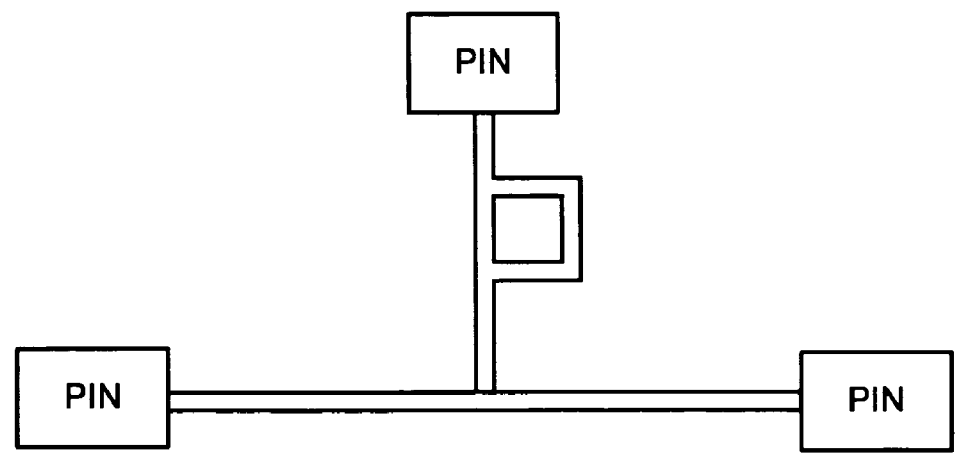
Figure 6A:
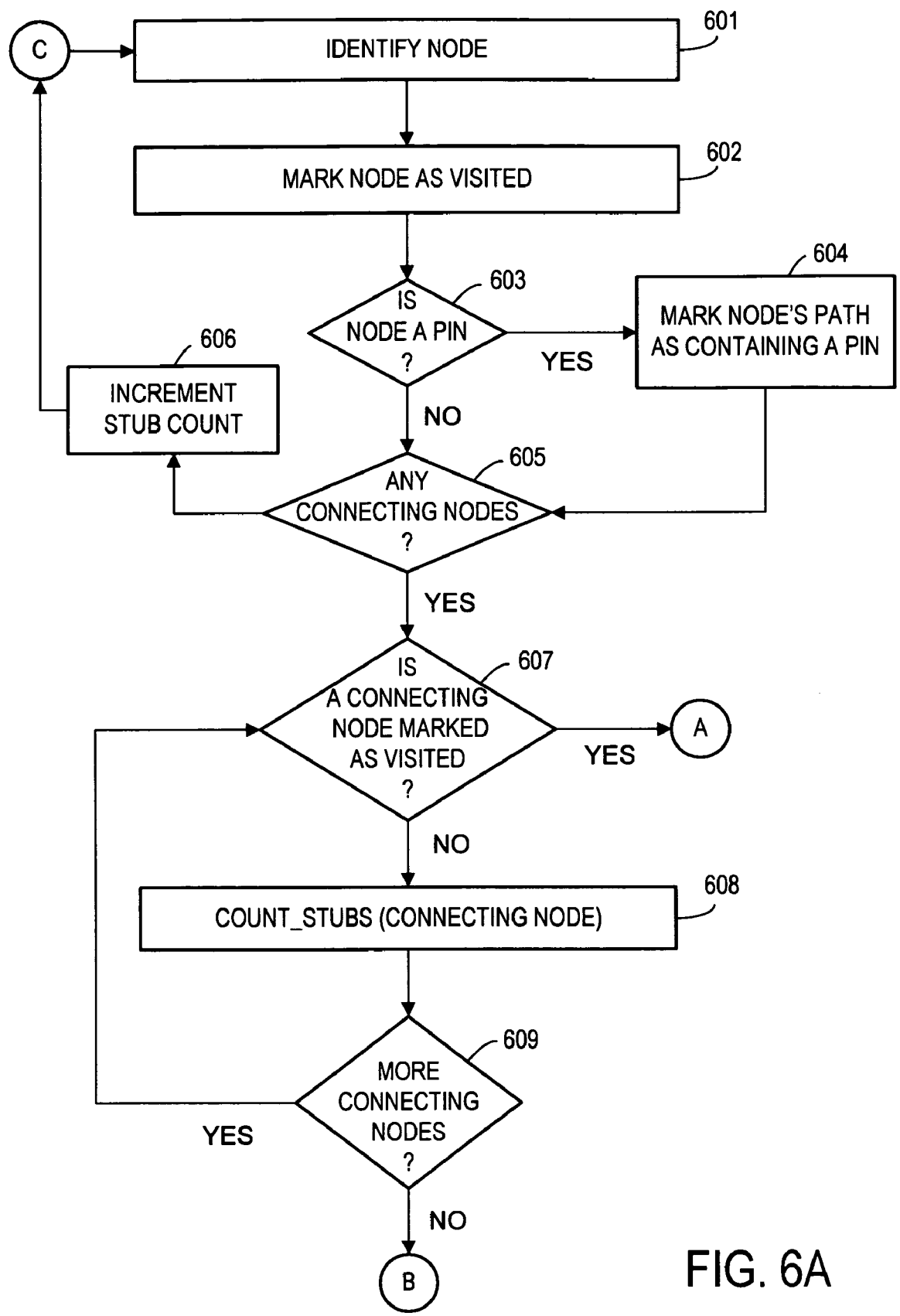
FIGS. 6A and 6B comprise a flow diagram according to some embodiments.
Figure 6B:
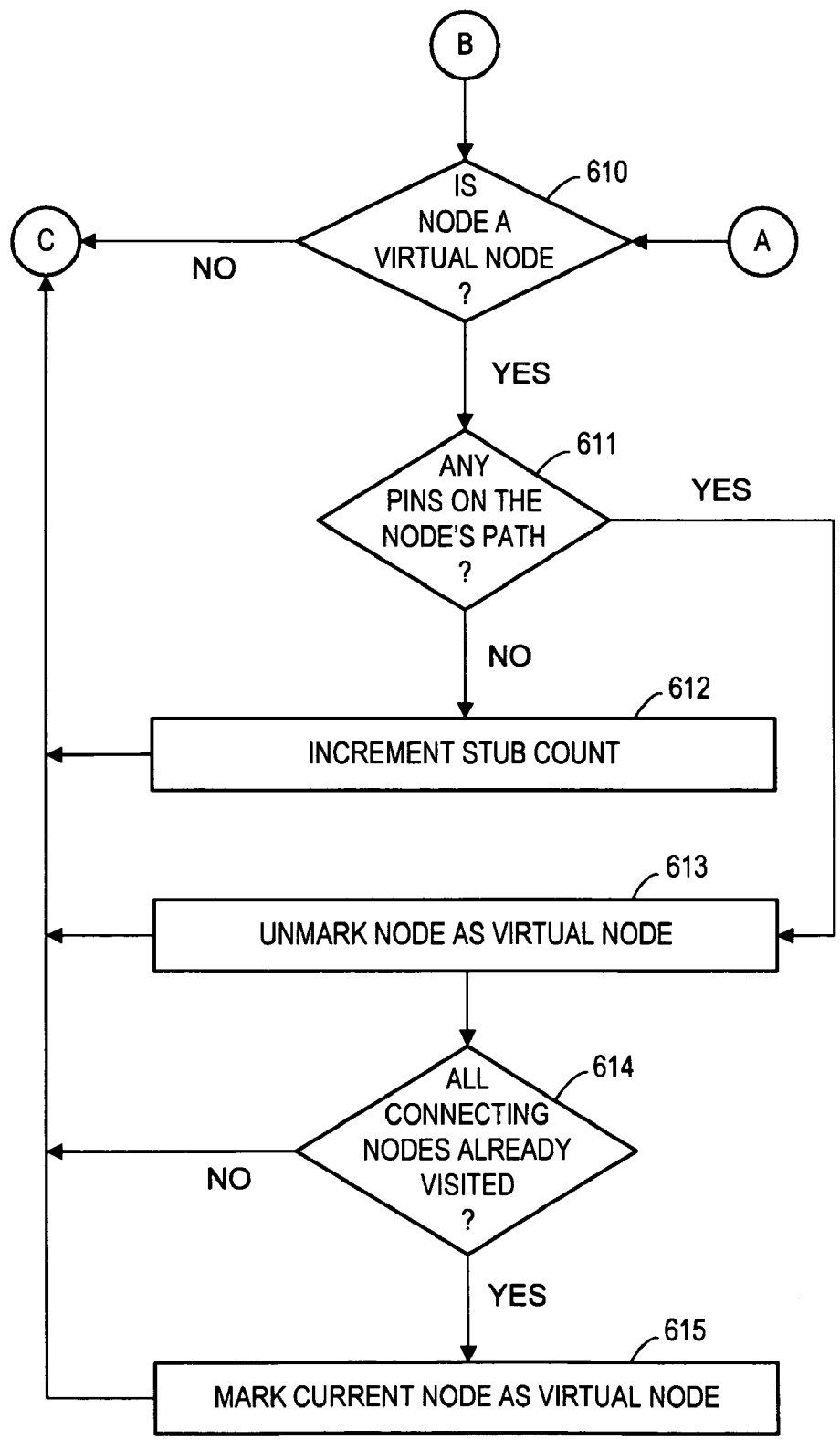

FIGS. 5A through 5C are views of various net layouts. FIG. 5A represents a stub, FIG. 5B represents a trace loop stub, and FIG. 5C represents a non-stub trace loop. Signal quality and/or timing specifications of some circuit designs may require that the number of stubs and trace-loop stubs on a substrate be limited to a certain amount. The process illustrated in FIGS. 6A and 6B may be used to identify stubs and to distinguish trace-loop stubs from no-stub trace loops.

At 601, a node of a circuit is identified. The node may be identified based on information associated with the circuit in layout information database 192. The circuit portion of FIG. 5A includes nodes N1 through N7, each of which is represented by a dot. It will be initially assumed that the node identified at 601 is node N1.

At 602, the identified node is marked as visited. According to some embodiments, the node is marked as visited using a flag that is associated with a data field representing the node. It is determined whether the node is a pin at 603. Since node N1 of the present example is a pin, the path of node N1 is marked as containing a pin at 604. A path of a node, according to some embodiments, may be defined as a trace segment terminated by a node at each end and including no other nodes. The path of node N1 may be marked at 604 using a data flag as described above with respect to 602. Flow continues to 605 from 604.

Flow also reaches 605 directly from 603 if the determination of 603 is negative. At 605, it is determined whether any nodes are connected to the identified node. Node N2 is connected to node N1, therefore the determination of 605 is positive in the case of node N1. If the current process were applied to node N6, node N6 would have been determined at 603 as not representing a pin and at 605 as not being connected to any nodes. Accordingly, node N6 would be identified as a stub node and a stub count would be incremented at 606 before flow returned to 601.

Returning to the processing of node N1, it is determined at 607 whether a connecting node is marked as visited. Node N2 has not yet been marked as visited, therefore the process of FIGS. 6A and 6B (identified as the function Count_Stubs) is applied to node N2 at 608. Such recursive application of the process, as will be evident to those in the art, may allow proper identification of trace-loop stubs and no-stub trace loops.

At 609, it is determined whether additional connecting nodes exist. Flow returns to 607 if additional connecting nodes are determined to exist, such as in the case of nodes N3 to N5. No additional connecting nodes exist in the case of node N1, therefore flow continues to 610. Flow also continues to 610 if it is determined that a connecting node is marked as visited at 607.

At 610, it is determined whether the node is a virtual node. If the determination is negative, flow returns to 601 to identify a next node. Initially, each node is marked as a virtual node therefore the determination of 610 with respect to node N1 is positive.

It is determined at 611 whether any pins exist on the node's path. Again, layout information database 192 may be used in the determination at 611. If no pins exist on the node's path, a trace loop stub such as that shown in FIG. 5B has been identified and the stub count is incremented at 612. The node is then unmarked as a virtual node at 613 and flow returns to 601.

Flow proceeds from 611 to 614 in a case that the determination of 611 is positive. At 614, it is determined whether all the connecting nodes identified at 605 are marked as visited. If not, flow returns to 601. If so, the current node is marked as a virtual node at 615 and flow returns to 601. According to some embodiments, the foregoing process may be used to determine a number of stubs in a circuit.

Figure 7A:
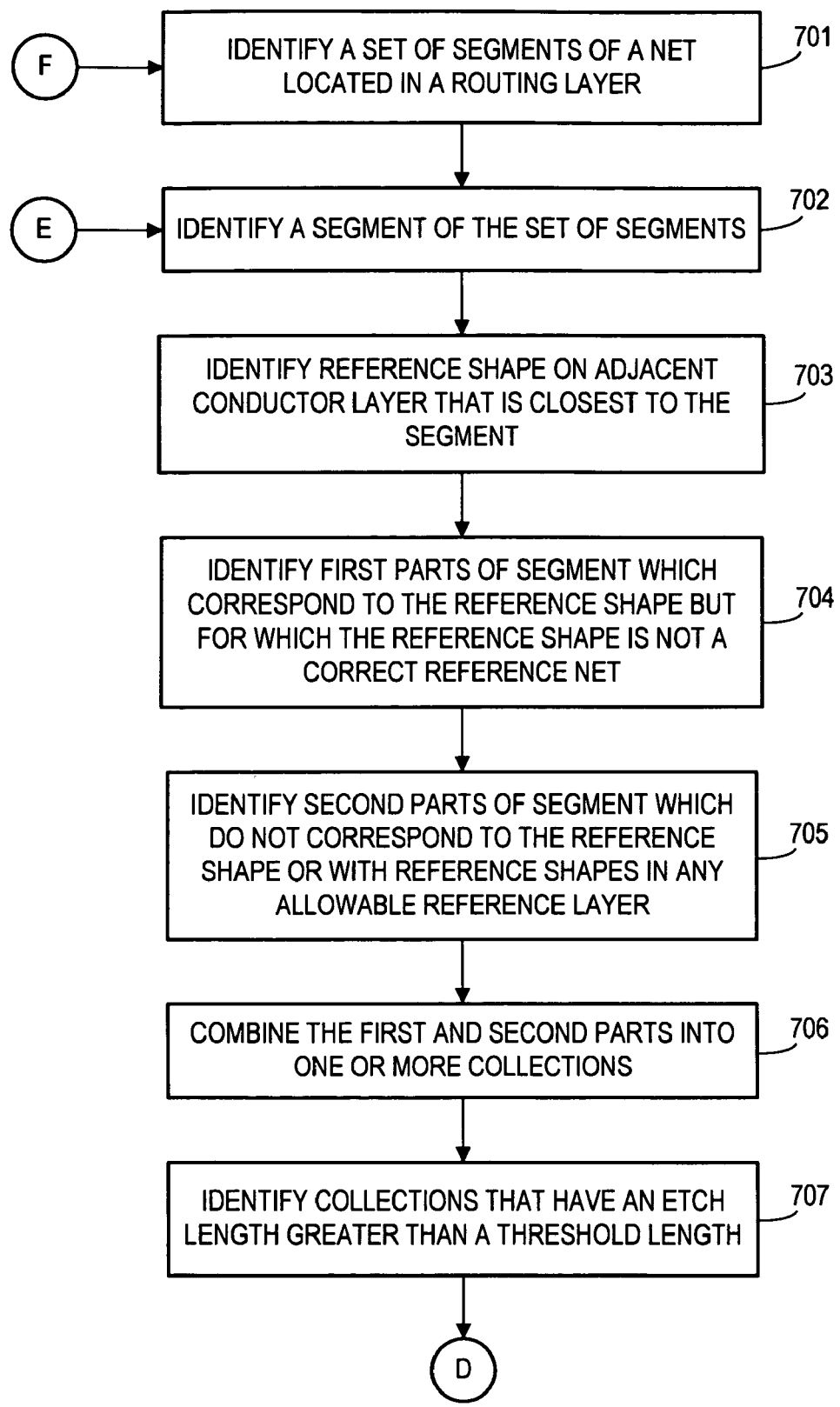
FIGS. 7A and 7B comprise a flow diagram according to some embodiments.
Figure 7B:
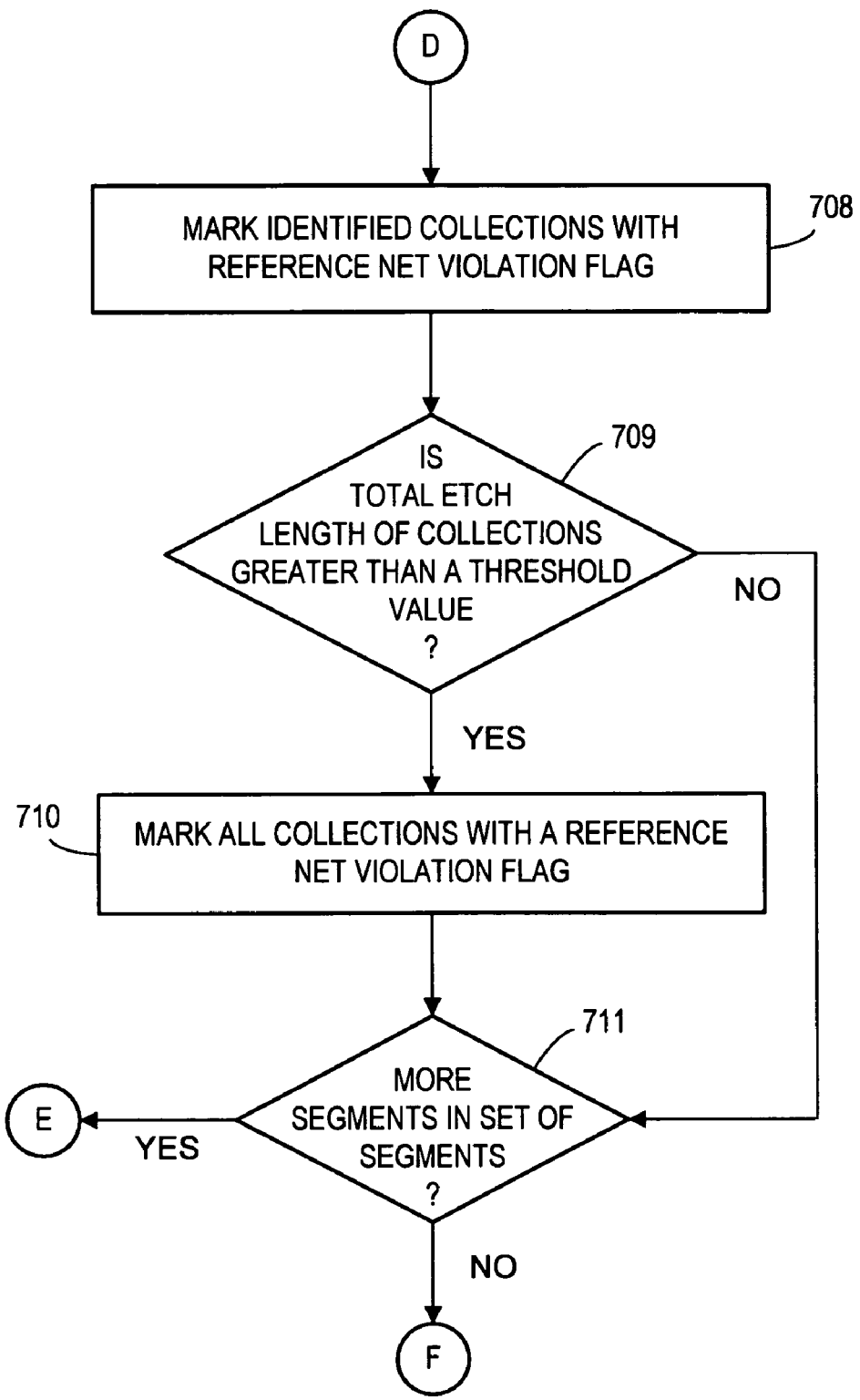

As described above, substrates may include nets for carrying signals. These nets may require reference nets, or planes, for carrying opposing current so as to provide proper signal transmission. Accordingly, a circuit design may associate a net with a reference net having a particular potential and disposed at a particular distance from the net. Some embodiments of the process of FIGS. 7A and 7B may be used to determine if a particular layout complies with the net/reference net associations specified by a circuit design.

Initially, at 701, a set of segments of a net is identified. The set of segments may be located in a single routing layer of a design, although the net may be located in one or more routing layers. The set of segments may be identified from among a list of nets stored in layout information database 192. The list may be associated with a particular circuit layout, and layout information database may include other information associated with the particular circuit layout. Such information may include reference net information as well as conductor, via and pin locations for each listed net.

Figure 8A:
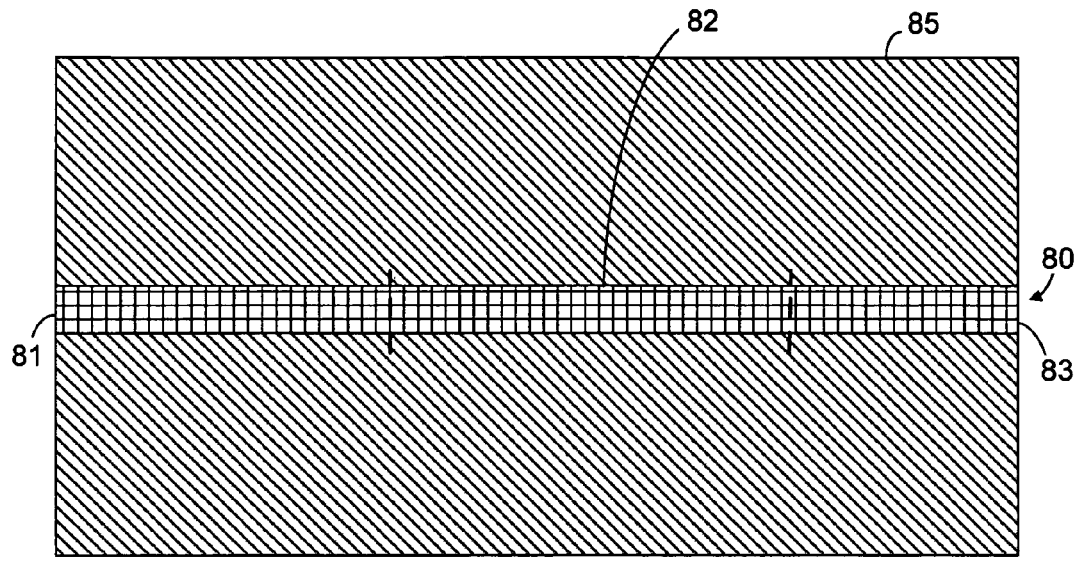
FIG. 8A is a top view of a set of segments of a net according to some embodiments.

A segment of the set of segments is identified at 702. FIG. 8A is a top view of a segment of net 80 located on dielectric layer 85. At 703, a reference shape located on an adjacent conductor layer is identified. The identified reference shape may be the closest reference shape to the identified segment.

Figure 8B:
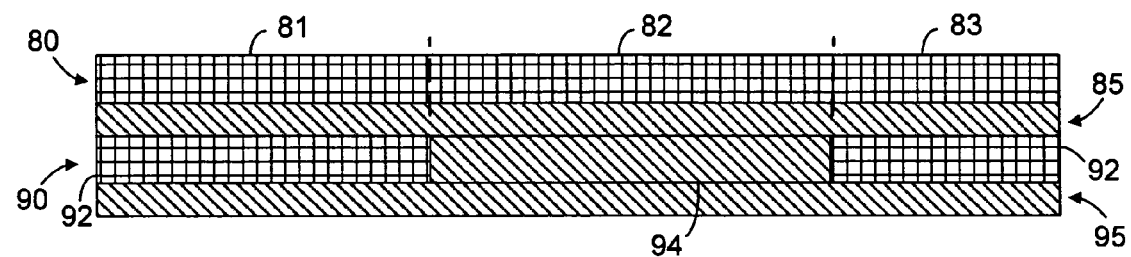
FIG. 8B is a cross-sectional side view of a set of segments of a net and reference nets according to some embodiments.

FIG. 8B is a cross-sectional side view of segment 80 and dielectric layer 85, and also includes routing layer 90 and dielectric layer 95. Routing layer 90 includes reference shape 92, which defines void 94. Void 94 may include material of a circuit board, such as but not limited to FR4 material, in some embodiments. According to the present example, reference shape 92 is associated with a particular electrical potential. Reference shape 92 is located closest to segment 80, and therefore is identified at 703 according to some embodiments.

Next, at 704, parts of the segment are identified which correspond to the reference shape but for which the reference shape is not a correct reference net. Returning to the present example, parts 81 and 83 of segment 80 correspond to reference shape 92 because reference shape 92 is located adjacent to such parts. However, it will be assumed that reference shape 92 is not a correct reference net for parts 81 and 83. The determination that reference shape 92 is not a correct reference net may be based on information associating segment 80 with a reference net in layout information database 192.

Second parts of the segment are then identified at 705. The identified second parts do not correspond to the reference shape. Moreover, the second identified parts do not correspond to reference shapes located in any allowable reference layer. Allowable reference layers may be defined prior to execution of the present process. For example, allowable reference layers may include two routing layers above and/or below the current routing layer of the segment under analysis. The allowable reference layers are those in which corresponding reference shapes are searched for according to some embodiments of 705. In the present example, part 82 is identified at 705 because part 82 does not correspond to the reference shape or to reference shapes located in any allowable reference layer.

The identified first and second parts are combined into one or more collections at 706. More specifically, first or second identified parts that are in contact with one another are combined to create a collection. Parts 81 through 83 are therefore combined to create a collection at 706.

Those collections that have a total etch length greater than a threshold length are then identified at 707. The threshold length may be preprogrammed based on particular tolerances set by a layout designer that may be hard-coded, user-definable, and/or device-dependent. The thusly-identified connected parts are then marked with a reference net violation flag at 708. Next, the total etch length of each of the one or more collections is compared with an allowable value. If the total etch length is greater than the allowable value, all the collections are marked with a reference net violation flag at 710.

At 711, it is determined if the identified set of segments includes additional segments. Flow proceeds directly to 711 from 709 if the total etch length of the one or more collections is greater than the allowable value. If so, flow returns to 702 to identify a next segment of the set of segments. If not, flow returns to 701 and proceeds as described above.

Figure 9:
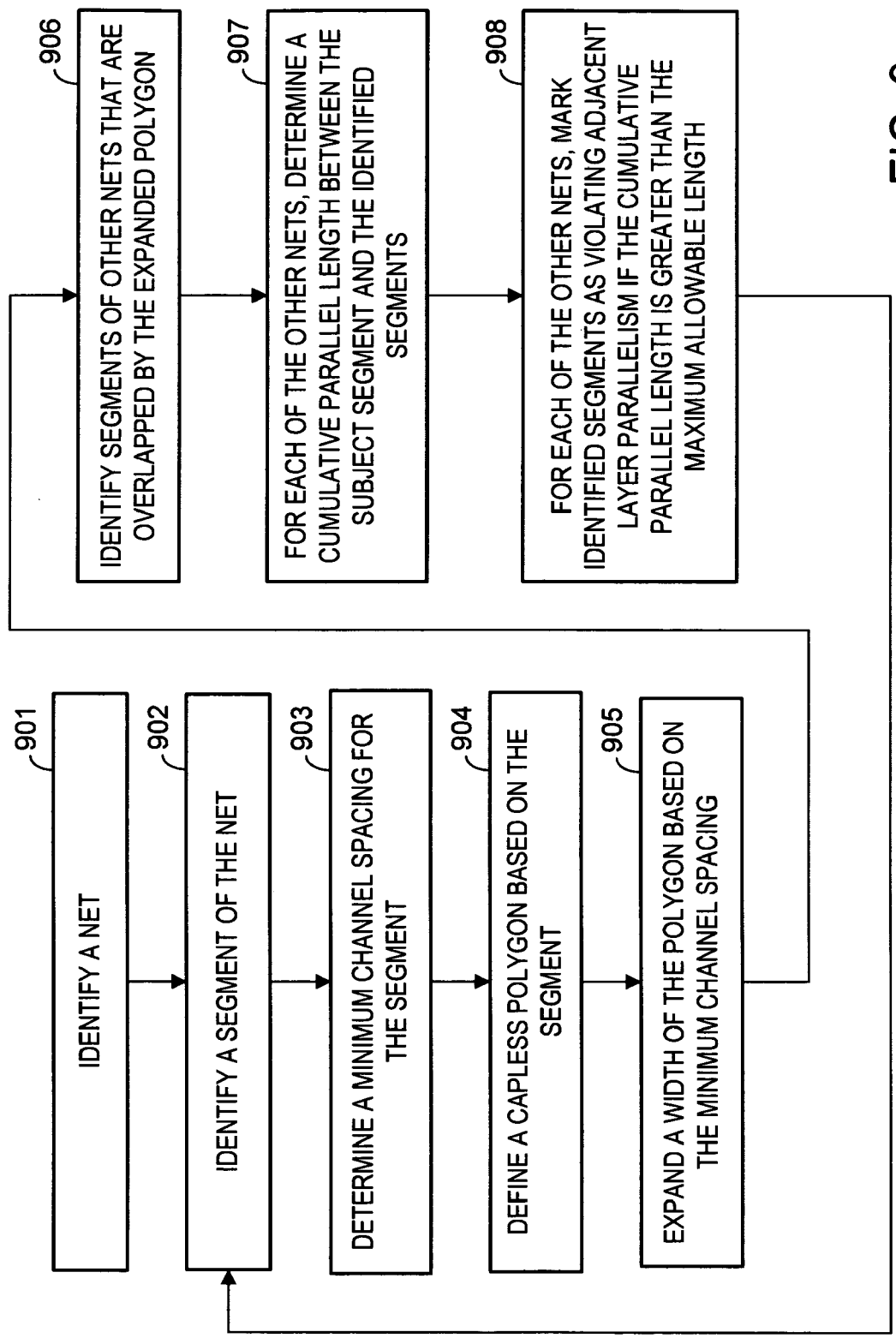
FIG. 9 is a flow diagram according to some embodiments.

Circuit layouts may also require checks to ensure that signals are not routed too closely to other signals on adjacent conductor layers. Close routing may cause interference between the signals and degrade signal quality. Such checks may be particularly useful in the case of high-speed signals, but they may be applied to any type of signals. FIG. 9 is a flow diagram of a process to check the parallelism between signals on adjacent conductor layers according to some embodiments.

At 901, a net is identified. The net may be a net for which an adjacent layer parallelism constraint is to be applied. The net may be identified from layout information stored in layout information database 192. A segment of the net is identified at 902. Next, a minimum channel spacing between the segment and a net on an adjacent layer is determined at 903.

Figure 10A:
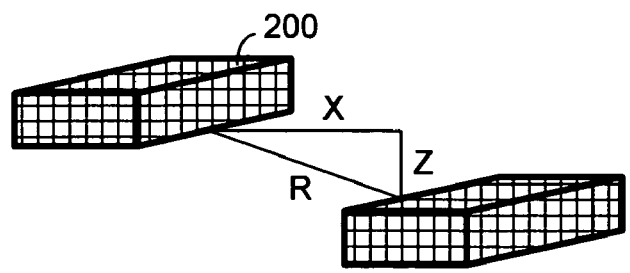
FIGS. 10A through 10C illustrate an arrangement of nets according to some embodiments.

FIG. 10A illustrates one method for determining the minimum channel spacing. Initially, a minimum radial spacing R associated with identified segment 200 is determined. The minimum radial spacing may be hard-coded, associated with identified segment 200 in layout information database 192 and/or otherwise determined. A thickness Z of an adjacent dielectric layer is then determined, and minimum channel spacing X is calculated using the equation $X=(R^2-Z^2)^{1/2}$.

Figure 10B:
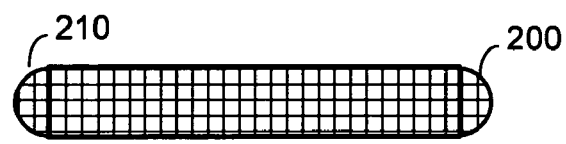
Figure 10C:
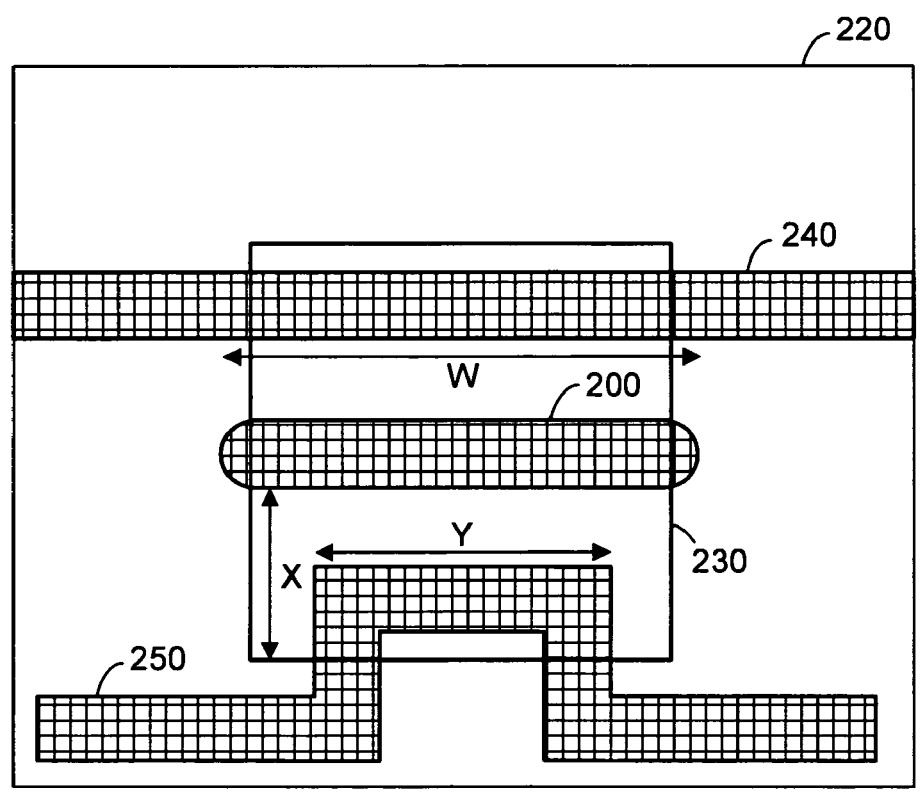

A capless polygon is created based on the identified segment at 904. A capless polygon outlines a portion of the segment using straight lines as illustrated by capless polygon 210 of FIG. 10B. A width of the capless polygon is then extended based on the minimum channel spacing X at 905. FIG. 10C illustrates a cross section of substrate 220 including a representation of expanded capless polygon 230.

Next, at 906, segments of other nets that are overlapped by the expanded polygon are identified. Using FIG. 10C as an example, segments 240 and 250 are identified at 906. In some embodiments, only some nets of substrate 220 are considered for identification at 906 and other nets may be excluded. Identification of the included nets may be provided in information database 192.

A cumulative parallel length between the subject segment and each of the identified segments of the other nets is determined at 907. The cumulative parallel length, for example, of segment 240 is denoted by W in FIG. 10C, and the cumulative parallel length of segment 250 is denoted by Y.

Identified segments of each of the other nets are marked as violating adjacent layer parallelism if the determined cumulative parallel length is greater than a predefined maximum allowable parallel length. In one example, the maximum allowable parallel length is greater than Y and less than W. Segment 240 is therefore marked as violating adjacent layer parallelism at 908. Flow returns to 902 from 908 to identify another segment of the subject net.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A method to evaluate a distance between polyline segments, comprising:

identifying a first polyline and a second polyline associated with a differential signal;

determining whether a distance between a segment of the first polyline and a segment of the second polyline is within a first tolerance;

if the distance is not within the first tolerance, determining whether the distance is within a second tolerance;

if the distance is not within the first tolerance and is within the second tolerance, determining whether the length of the segment of the first polyline is less than a first threshold;

indicating that the first polyline and the second polyline are sufficiently spaced if the distance is not within the first tolerance and is within the second tolerance, and if the length of the segment of the first polyline is less than the first threshold;

if the distance is not within the second tolerance or if the length of the segment of the first polyline is greater than the first threshold, determining whether the segments are located near a device pin; and if the segments are not located near a device pin, indicating that the first polyline and the second polyline are not sufficiently spaced.

2. The method according to claim 1, further comprising:

if the distance is not within the second tolerance or if the length of the segment of the first polyline is greater than the first threshold, indicating that the first polyline and the second polyline are not sufficiently spaced.

3. The method according to claim 1, wherein indicating comprises:

indicating that the first polyline and the second polyline are sufficiently spaced if the distance is not within the first tolerance and is within the second tolerance, if the length of the segment of the first polyline is less than the first threshold, and if the first polyline and the second polyline are sufficiently spaced from other polylines.

4. A medium storing processor-executable code to evaluate a distance between polyline segments, the code comprising:

code to identify a first polyline and a second polyline associated with a differential signal;

code to determine whether a distance between a segment of the first polyline and a segment of the second polyline is within a first tolerance;

code to determine, if the distance is not within the first tolerance, whether the distance is within a second tolerance;

code to determine, if the distance is not within the first tolerance and is within the second tolerance, whether the length of the segment of the first polyline is less than a first threshold;

code to indicate that the first polyline and the second polyline are sufficiently spaced, if the distance is not within the first tolerance and is within the second tolerance, and if the length of the segment of the first polyline is less than the first threshold;

code to determine, if the distance is not within the second tolerance or if the length of the segment of the first polyline is greater than the first threshold, whether the segments are located near a device pin; and code to indicate, if the segments are not located near a device pin, that the first polyline and the second polyline are not sufficiently spaced.

5. The medium according to claim 4, the code further comprising:

code to indicate that the first polyline and the second polyline are not sufficiently spaced, if the distance is not within the second tolerance or if the length of the segment of the first polyline is greater than the first threshold.

6. A system to evaluate a distance between polyline segments, comprising:
   a processor;
   a fixed disk drive coupled to the processor and storing processor-executable code, the code comprising:
      code to identify a first polyline and a second polyline associated with a differential signal;
      code to determine whether a distance between a segment of the first polyline and a segment of the second polyline is within a first tolerance;
      code to determine, if the distance is not within the first tolerance, whether the distance is within a second tolerance;
      code to determine, if the distance is not within the first tolerance and is within the second tolerance, whether the length of the segment of the first polyline is less than a first threshold;
      code to indicate that the first polyline and the second polyline are sufficiently spaced, if the distance is not within the first tolerance and is within the second tolerance, and if the length of the segment of the first polyline is less than the first threshold;
      code to determine, if the distance is not within the second tolerance or if the length of the segment of the first polyline is greater than the first threshold, whether the segments are located near a device pin; and
      code to indicate, if the segments are not located near a device pin, that the first polyline and the second polyline are not sufficiently spaced; and
   a double data rate memory coupled to the processor.

7. The system according to claim 6, the code further comprising:
   code to indicate that the first polyline and the second polyline are not sufficiently spaced, if the distance is not within the second tolerance or if the length of the segment of the first polyline is greater than the first threshold.

* * * * *